United States Patent
Wang et al.

(10) Patent No.: US 11,917,923 B2
(45) Date of Patent: Feb. 27, 2024

(54) MAGNETORESISTIVE RANDOM ACCESS MEMORY STRUCTURE

(71) Applicant: UNITED MICROELECTRONICS CORP., Hsin-Chu (TW)

(72) Inventors: Hui-Lin Wang, Taipei (TW); Ching-Hua Hsu, Kaohsiung (TW); Si-Han Tsai, Taichung (TW); Shun-Yu Huang, Kaohsiung (TW); Chen-Yi Weng, New Taipei (TW); Ju-Chun Fan, Tainan (TW); Che-Wei Chang, Taichung (TW); Yi-Yu Lin, Taichung (TW); Po-Kai Hsu, Taichung (TW); Jing-Yin Jhang, Tainan (TW); Ya-Jyuan Hung, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 287 days.

(21) Appl. No.: 17/242,322

(22) Filed: Apr. 28, 2021

(65) Prior Publication Data

US 2022/0310902 A1    Sep. 29, 2022

(30) Foreign Application Priority Data

Mar. 24, 2021    (CN) .......................... 202110311963.3

(51) Int. Cl.
| | |
|---|---|
| *H10N 50/80* | (2023.01) |
| *H10B 61/00* | (2023.01) |
| *H10N 50/01* | (2023.01) |
| *H10N 50/10* | (2023.01) |
| *H01L 27/22* | (2006.01) |
| *H01L 43/12* | (2006.01) |

(52) U.S. Cl.
CPC .............. *H10N 50/80* (2023.02); *H10B 61/00* (2023.02); *H10N 50/01* (2023.02); *H10N 50/10* (2023.02)

(58) Field of Classification Search
CPC ........ H10N 50/80; H10N 50/01; H10N 50/10; H10N 52/01; H10B 61/00; G11C 11/161; H01L 43/12; H01L 43/08; H01L 43/14; H01L 27/222; H01L 43/02; H01L 27/22
USPC ........................................................ 257/421
See application file for complete search history.

(56) References Cited

U.S. PATENT DOCUMENTS

| | | | | |
|---|---|---|---|---|
| 2020/0066580 | A1* | 2/2020 | Peng | ................. H01L 21/31056 |
| 2020/0111951 | A1* | 4/2020 | Dutta | ..................... H10N 50/10 |
| 2020/0403032 | A1* | 12/2020 | Dutta | ..................... H10N 50/01 |

(Continued)

OTHER PUBLICATIONS

Sungwoo Lee et al., "Effect of etching on dielectric constant and surface composition of SiCOH low-k films in inductively coupled fluorocarbon plasmas", Thin Solid Films 517 (2009) 3942-3946, Available online Feb. 3, 2009 (Year: 2009).*

(Continued)

*Primary Examiner* — Fazli Erdem
(74) *Attorney, Agent, or Firm* — Winston Hsu (57) ABSTRACT

A magnetoresistive random access memory (MRAM) structure, including a substrate and multiple MRAM cells on the substrate, wherein the MRAM cells are arranged in a memory region adjacent to a logic region. An ultra low-k (ULK) layer covers the MRAM cells, wherein the surface portion of ultra low-k layer is doped with fluorine, and dents are formed on the surface of ultra low-k layer at the boundaries between the memory region and the logic region.

12 Claims, 6 Drawing Sheets

(56) References Cited

U.S. PATENT DOCUMENTS

| | | | |
|---|---|---|---|
| 2021/0020691 A1* | 1/2021 | Wang | G11C 11/161 |
| 2021/0020694 A1* | 1/2021 | Huang | H01L 23/53295 |
| 2021/0242277 A1* | 8/2021 | Dutta | H10N 50/80 |
| 2022/0302369 A1* | 9/2022 | Wang | H10N 50/80 |

OTHER PUBLICATIONS

Chen et al., "Thermodynamic Stability of Low-k Amorphous SiOCH Dielectric Films", J. Am. Ceram. Soc., 99 [8] 2752-2759 (2016). (Year: 2016).*

* cited by examiner

MAGNETORESISTIVE RANDOM ACCESS MEMORY STRUCTURE

BACKGROUND OF THE INVENTION

1. Field of the Invention

The present invention relates generally to a magnetoresistive random access memory (MRAM), and more specifically, to a MRAM structure provided with an ultra low-k (dielectric constant) layer and particular material compositions thereof.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate magnetoresistive random access memory (MRAM) devices, which typically has the advantage of keeping stored data even when the device is not connected to an electrical source.

MRAM is a kind of non-volatile memory that has drawn a lot of attention in this technology field recently regarding its potentials of incorporating advantages of other kinds of memories. For example, an MRAM device may have an operation speed comparable to SRAMs, the non-volatile feature and low power consumption comparable to flash, the high integrity and durability comparable to DRAM. More important, the process for forming MRAM devices may be conveniently incorporated into current semiconductor manufacturing processes. Thus, it has the potential to become primary memory used in semiconductor chips.

A typical MRAM cell structure usually comprises a memory stack structure comprising magnetic tunnel junction (MTJ) set between lower and upper interconnecting structures. Unlike conventional memories that data is stored by electric charge or current flow, an MRAM cell stores data by applying external magnetic fields to control the magnetic polarity and tunneling magnetoresistance (TMR) of the magnetic tunnel junction.

SUMMARY OF THE INVENTION

The present invention provides a magnetoresistive random access memory (MRAM) structure, featuring fluorine-doped surface portion of an ultra low-k layer due to an etch back process, and dents are formed on the surface of the ultra low-k layer at the boundary of cell region and logic region.

One aspect of present invention is to provide a magnetoresistive random access memory (MRAM) structure, including a substrate, multiple MRAM cells on the substrate, wherein the MRAM cells are in a cell region adjacent to a logic region, and an ultra low-k layer covering the MRAM cells, wherein dents are formed on a surface of the ultra low-k layer at boundaries between the cell region and the logic region.

Another aspect of present invention is to provide a magnetoresistive random access memory (MRAM) structure, including a substrate, multiple MRAM cells on the substrate, wherein the MRAM cells are in a cell region adjacent to a logic region, and an ultra low-k layer covering the MRAM cells, wherein the ultra low-k layer includes a fluorine doped surface portion, and a silicon percentage, a hydrogen percentage and a carbon percentage in the ultra low-k layer gradually increase inward from a surface of the ultra low-k layer to respective levels and then remain constant, and an oxygen percentage in the ultra low-k layer gradually decreases inward from the surface of ultra low-k layer to a level and then remain constant, and a fluorine percentage in the ultra low-k layer gradually increases inward from the surface of ultra low-k layer to a depth and then start to decrease gradually to 0%.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
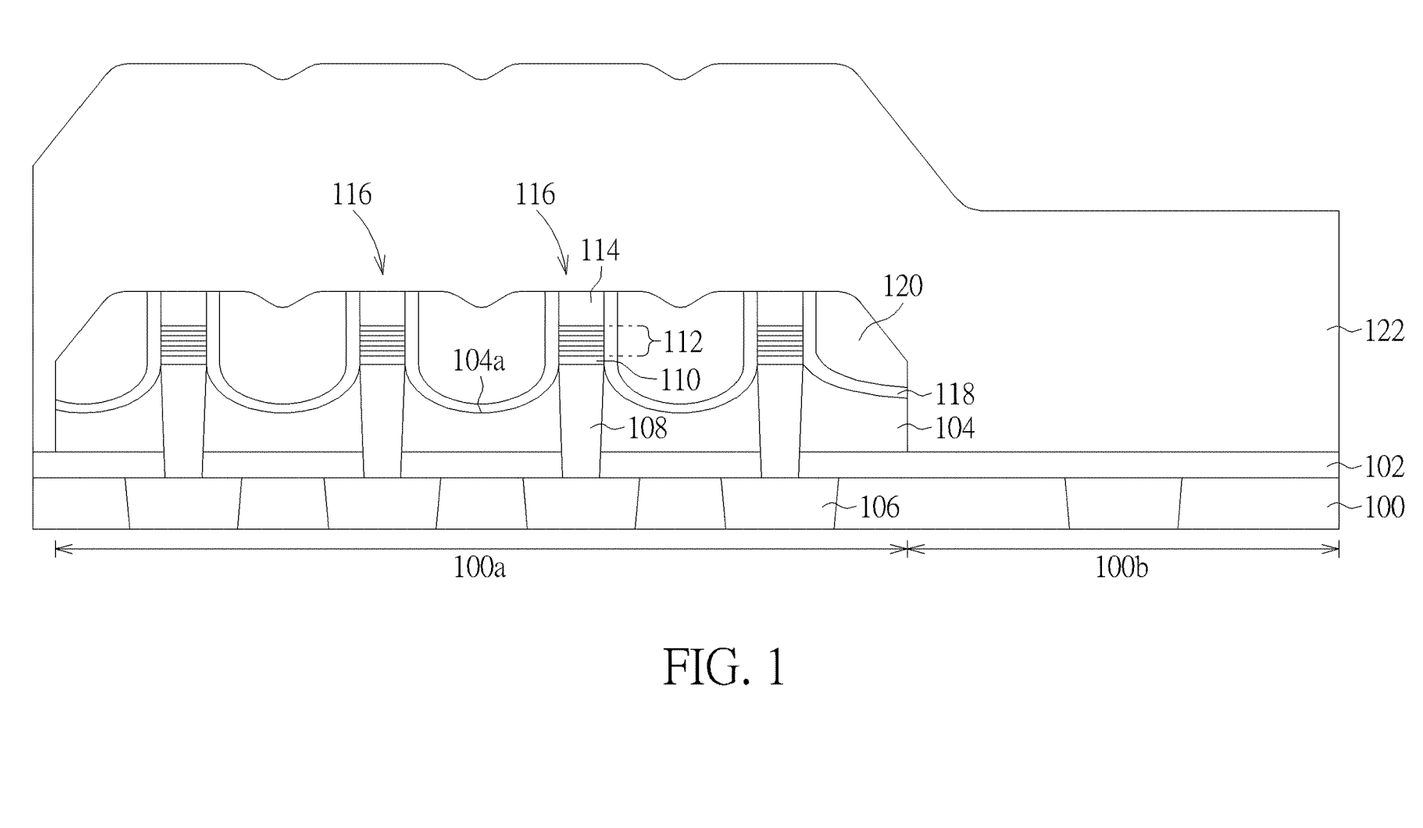
FIGS. 1-5 are cross-sections of a process flow of manufacturing a magnetoresistive random access memory (MRAM) structure in accordance with one embodiment of the present invention.

Please refer to FIG. 1 to FIG. 5, which are cross-sections illustrating a process flow of manufacturing a magnetoresistive random access memory (MRAM). As shown in FIG. 1, firstly, provide a substrate (not shown) such as a substrate made of semiconductor materials, wherein the semiconductor materials may be selected from silicon (Si), germanium (Ge), silicon-germanium alloy (SiGe), silicon carbide compound (SiC), silicon arsenide compound (SiAs) or the combination thereof. The substrate is preferably defined with a cell region 100a and a logic region 100b thereon to be used for setting memory arrays and logic circuits (ex. word lines or peripheral circuits). Please note that the key points of present invention focus on the structure of MRAM cells on the cell region 100a and relevant processes.

Refer still to FIG. 1. An inter-metal dielectric (IMD) layer 100, a stop layer 102 and a dielectric layer 104 are formed sequentially on the substrate through chemical vapor deposition (CVD) or plasma-enhanced chemical vapor deposition (PECVD) process. In the embodiment of present invention, the inter-metal dielectric layer 100 may be an inter-metal dielectric layer in lower metal interconnect tiers (ex. a second metal layer M2), which the material is preferably ultra low-k (low dielectric constant, ULK) material, such as porous silicon oxycarbide (SiOC). A metal interconnect layer 106, such as the second metal layer M2, may be formed in the inter-metal dielectric layer 100. The material of stop layer 102 is preferably silicon carbonitride (SiCN), nitrogen-doped carbide (NDC) or silicon nitride, etc., to function as an etching stop layer when forming upper contact holes. The material of dielectric layer 104 is preferably but not limited to tetraethoxysilane (TEOS).

Refer still to FIG. 1. Multiple MRAM cells 116 are formed on the dielectric layer 104, wherein each MRAM cells 116 includes a bottom electrode layer 110, a magnetic tunnel junction (MTJ) stack 112 and a top electrode layer 114 from bottom up and is electrically connect to a metal interconnect layer 106 in the cell region 100a by a via 108 through underlying dielectric layer 104 and stop layer 102. In the embodiment of present invention, the bottom electrode layer 110, the magnetic tunnel junction stack 112 and the top electrode layer 114 may be in-situ formed in the same chamber by physical vapor deposition (PVD) process. In the embodiment of present invention, the material of bottom electrode layer 110 preferably includes conductive materials such as tantalum nitride (TaN), but not limited thereto. According other embodiments of present invention, the bottom electrode layer 110 may include tantalum (Ta), platinum (Pt), copper (Cu), gold (Au), aluminum (Al) or the combination thereof. The material of top electrode layer 114 is preferably titanium nitride (TiN). The material of metal interconnect layer 106 and via 108 may be selected from but not limited to tungsten (W), copper (Cu), aluminum (Al), titanium aluminide (TiAl), cobalt tungsten phosphide (CoWP) or the combination thereof.

In the embodiment of present invention, the magnetic tunnel junction stack 112 is a multilayer structure, which may include structures like seed layer, pinned layer, reference layer, tunnel barrier layer, free layer and metal spacer, etc. Generally, the pinned layer could be made of antiferromagnetic (AFM) material including but not limited to ferromanganese (FeMn), platinum manganese (PtMn), iridium manganese (IrMn), nickel oxide (NiO) or combination thereof, to fix or restrict the direction of magnetic moment of adjacent layers. The tunnel barrier layer may include oxide containing insulating material such as aluminum oxide ($AlO_x$) or magnesium oxide (MgO), but not limited thereto. The free layer may be made of ferromagnetic material including but not limited to iron (Fe), cobalt (Co), nickel (Ni) or the alloys thereof, such as cobalt-iron-boron (CoFeB) alloy, in which the magnetized direction of the free layer could be altered freely depending on the influence of external magnetic field. Since detailed structure of the magnetic tunnel junction stack 112 is not the key point of present invention, all of the aforementioned multilayer structure will be represented by the magnetic tunnel junction stack 112 in the drawings.

In the embodiment of present invention, the top electrode layer 114, the magnetic tunnel junction stack 112 and the bottom electrode layer 110 may be patterned by a photolithography process to define individual MRAM cells 116, wherein a reactive ion etching (RIE) process may be first used with a silicon oxide layer as hard mask to pattern the top electrode layer 114, so that less sidewall byproduct will be formed in the process. An ion beam etching (IBE) process is then used to pattern the magnetic tunnel junction stack 112 and the bottom electrode layer 110 to define the MRAM cells 116. The IBE process may also remove parts of the dielectric layer 104. Since the characteristics of ion beam etching process, the surface 104a of remaining dielectric layer 104 after etching would be preferably lower than the upper surface of via 108 and is preferably a cambered or curved surface.

Refer still to FIG. 1. After the patterning process, a conformal liner 118 is further formed on the surface of MRAM cells 116 and the dielectric layer 104, wherein the material of liner 118 preferably includes silicon nitride. However, other dielectric material such as silicon oxide, silicon oxynitride (SiON) or silicon oxide carbide (SiOC) may also be selected depending on process requirements. The liner 118 has uniform thickness, covering on the MRAM cells 116 and the dielectric layer 104 but exposing the top electrode layer 114 of the MRAM cells 116. Thereafter, an atomic layer deposition (ALD) dielectric layer 120 is further formed on the liner 118, with the material including but not limited to tetraethyl orthosilicate (TEOS), silicon oxide, silicon nitride or the combination thereof. In comparison to the approach of using ultra low-k (ULK) material directly covering on the MRAM cells 116 in prior art, atomic layer deposition process is used in the present embodiment to form additional dielectric layers and efficiently prevent gaps formed between the MRAM cells 116, thereby achieving better surface coverage. The surface of atomic layer deposition dielectric layer 120 in the peripheral of cell region 100a is a curved surface concave downward to the boundaries between the cell region 100a and the logic region 100b and is flush with the sidewalls of underlying liner 118 and dielectric layer 104.

Refer still to FIG. 1. In addition to the aforementioned structures, an ultra low-k (ULK) layer 122 is blanket-deposited on the substrate surface, covering entire cell region 100a and logic region 100b. The material of ultra low-k layer 122 may be porous silicon oxycarbide (SiCOH), which may be formed by CVD process. Please note that the dielectric constants of atomic layer deposition dielectric layer 120 and ultra low-k layer 122 are different. In the embodiment of present invention, since vias 108 and MRAM cells are set on the cell region 116, the surface of cell region 100a and logic region 100b will have substantial different after the ultra low-k layer 122 is formed. This different is unfavorable to the later processes.

Figure 2:
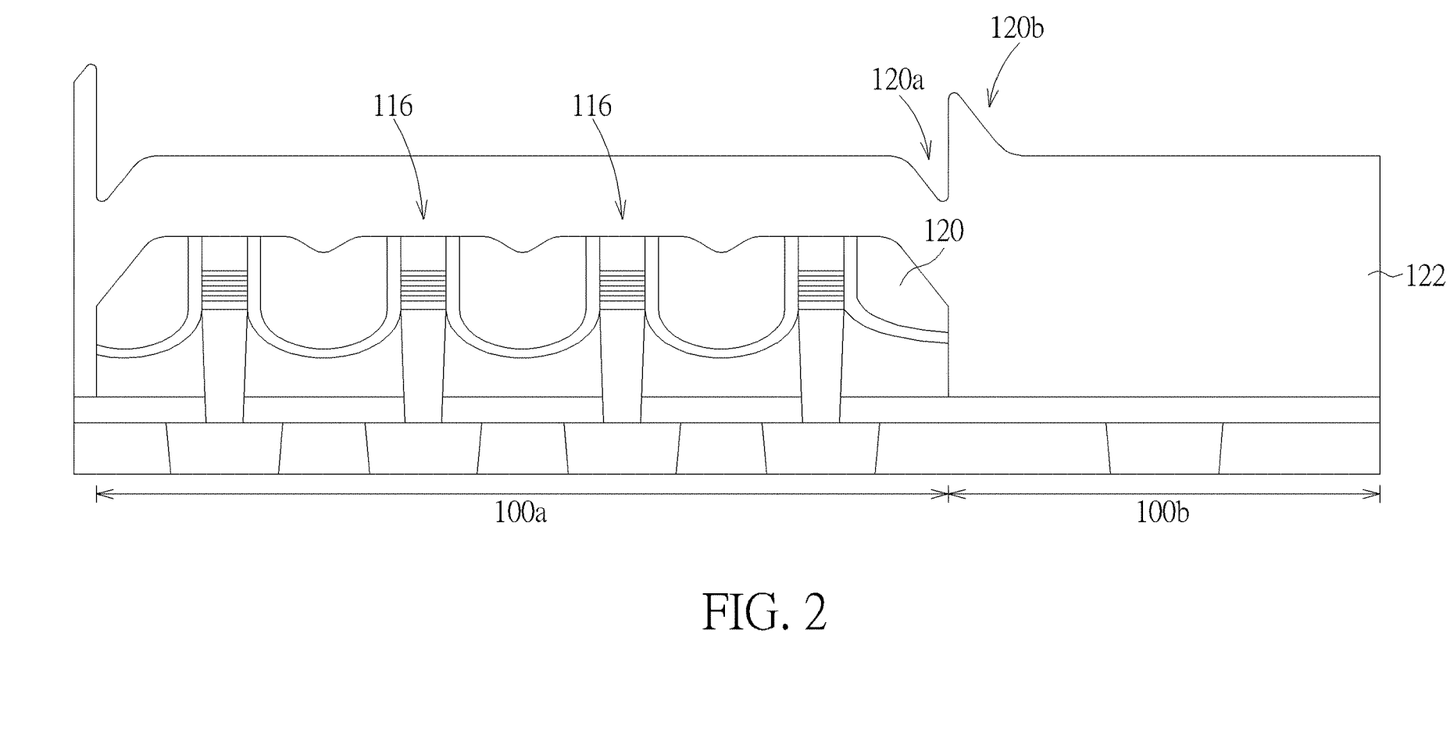
Figure 3:
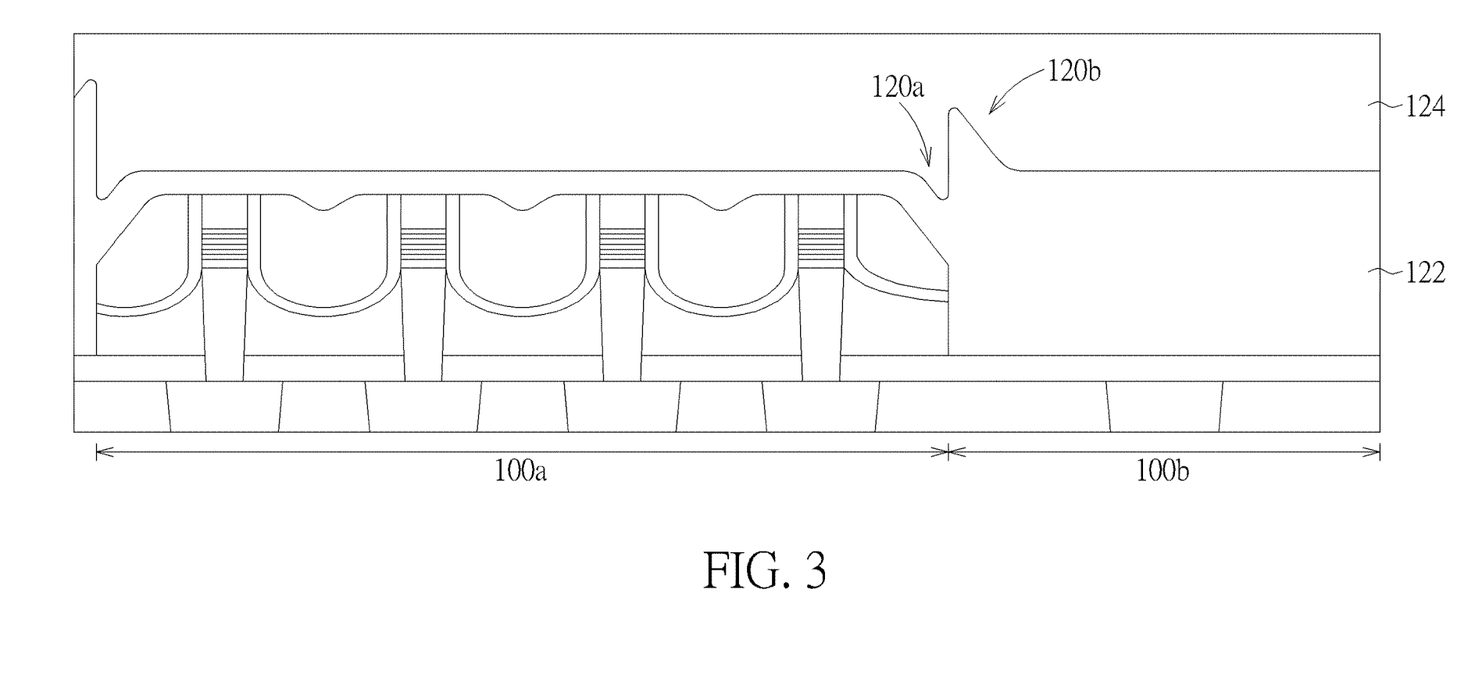

In the light of this problem, please refer to FIG. 2. After forming the ultra low-k layer 122, a photolithography process is performed to remove parts of the ultra low-k layer 122 on the cell region 100a (or the word line region). The photolithography process may include steps of forming a patterned photoresist (or hard mask, not shown) on the regions outside of the cell region 100a, such as the logic region 100b. The photoresist would expose the ultra low-k layer 122 on the cell region 100a. An anisotropic etching process may then be performed using the photoresist as an etching mask to remove the ultra low-k layer 122 in a predetermined thickness on the cell region 100a. Please note that in the embodiment of present invention, the ultra low-k layer 122 with a certain thickness would remain on the atomic layer deposition dielectric layer 120 and the MRAM cells 116 in the cell region 100a after the etching process. Furthermore, due to the etching process, a dent is formed at the boundary between the cell region 100a and the logic region 100b at the side close to the cell region 100a, while a protrusion 120b is formed at the side close to the logic region 100b. These features are resulted from the relative height difference of original ultra low-k layer 122 at the boundary.

In the embodiment of present invention, since the protrusion 120b and the surface after the etch back process still have substantial height difference, a post treatment is still required to remove the height difference. Please refer now to FIG. 3. After the etch back process, an organic planarization layer (OPL) 124 is then formed on the ultra low-k layer 122. The purpose of organic planarization layer 124 is to planarize the surface of ultra low-k layer 122, with material like spin-on carbon (SOC), organic dielectric layer (ODL), bottom anti-reflective coating (BARC) or photoresist with a thickness about 1000 Å to 3000 Å, to be formed on the ultra low-k layer 122 by spin coating process and fill up the dent 120a.

Figure 4:
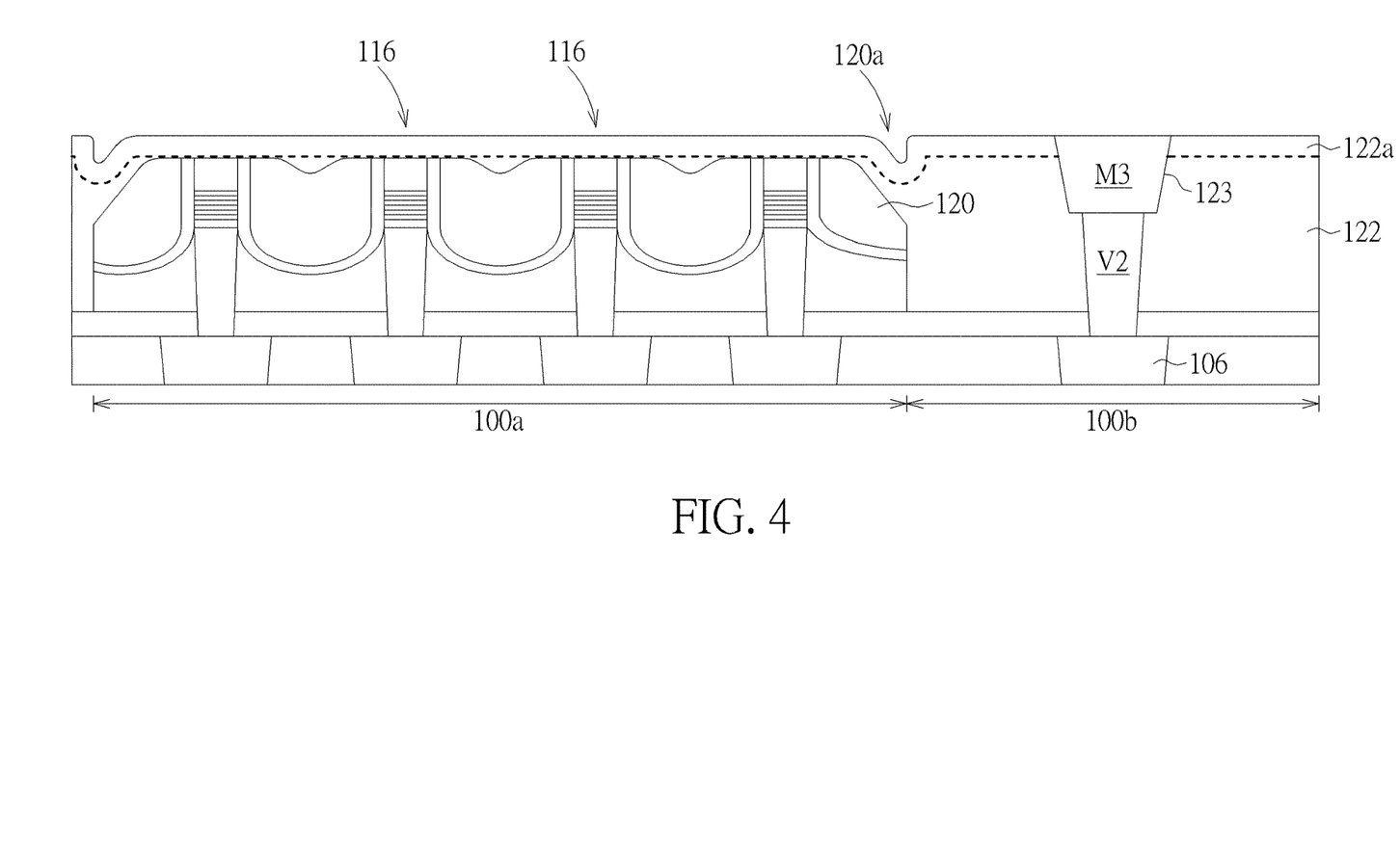

Please refer to FIG. 4. After forming the organic planarization layer 124, an etch back process is then performed to remove the organic planarization layer 124. Please note that in the embodiment of present invention, the etch back process has the same etching rate to the organic planarization layer 124 and underlying ultra low-k layer 122. Therefore, the etch back process would also remove parts of the ultra low-k layer 122 while removing the organic planarization layer 124 and attain a flat surface after the etching. It can be seen in FIG. 4 that the original protrusion 120b of ultra low-k layer 122 is also removed in the etch back process, but parts of ultra low-k layer 122 with a certain thickness would still remain on the atomic layer deposition dielectric layer 120 and the MRAM cells in the cell region 100a, and the dent 120a would still remain at the boundary of cell region 100a and logic region 100b. In other embodiment, the etch back process may lower the height of the protrusion 120a rather than completely remove it. After the etch back process, an ashing process may be optionally performed to remove the remaining organic planarization layer 124 in the dent 120a.

Figure 6:
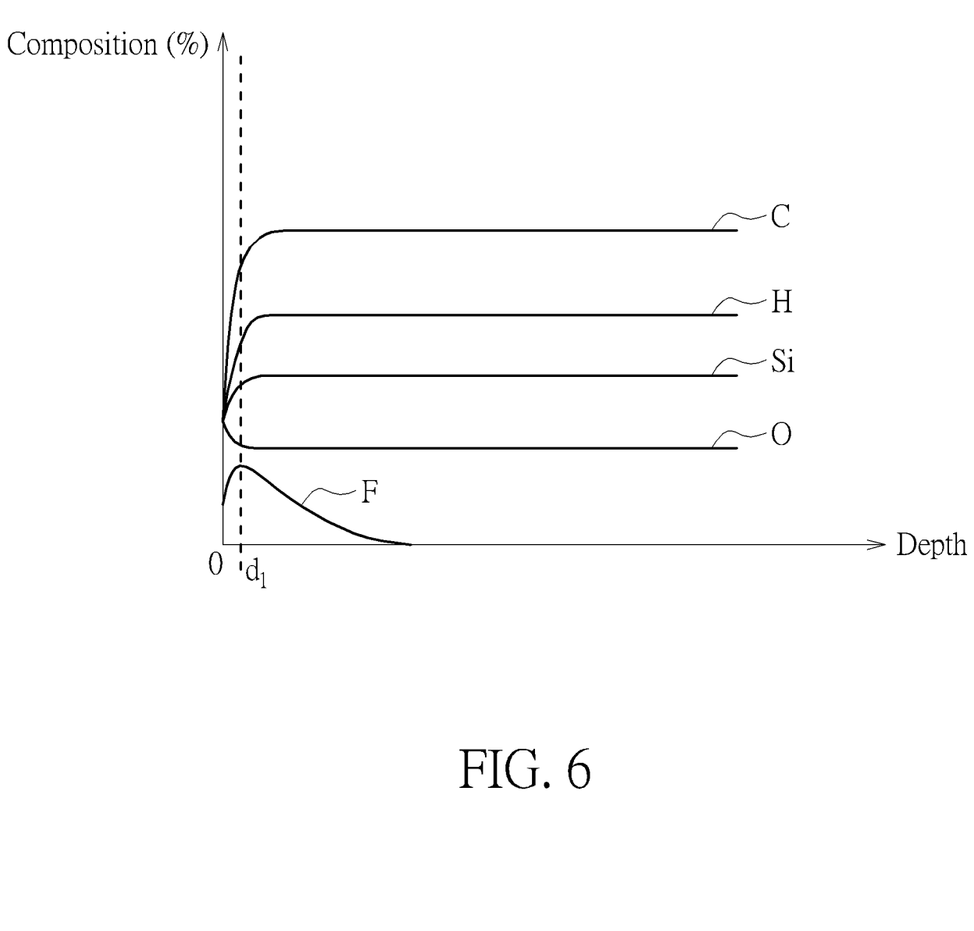
FIG. 6 is a curve chart of the depth versus the composition of an ultra low-k (ULK) layer in the MRAM cell in accordance with the embodiment of the present invention.

Through this process, generally, the cell region 100a and the logic region 100b would have the same surface level to provide flat surface for later processes. Please note that in the embodiment of present invention, the composition of surface portion (the portion above the dashed line shown in the FIG. 122a of the etched ultra low-k layer 122 would be effected and altered by the etch back processes, as shown in FIG. 6. FIG. 6 is a curve chart of the depth versus the composition of ultra low-k layer 122, wherein the x-axis in the figure is the independent variable representing the vertical depth inward from the surface of ultra low-k layer 122, and y-axis is the dependent variable representing the compositions of carbon (C), hydrogen (H), silicon (Si), oxygen (O) and fluorine (F) in corresponding depths. It can be seen in the figure that, in the embodiment of present invention, the percentages of carbon, hydrogen, silicon and oxygen are generally the same at the surface of ultra low-k layer 122, wherein the hydrogen percentage, the carbon percentage and the silicon percentage would gradually increase inward from the surface of ultra low-k layer 122 to respective levels (i.e. their inherent percentages) and then remain constant, while the oxygen percentage would gradually decrease inward from the surface of ultra low-k layer 122 to its inherent level and then remain constant. Generally, in the ultra low-k layer 122, the inherent carbon percentage is greater than the inherent hydrogen percentage and further greater than the inherent silicon percentage and the inherent oxygen percentage. In the embodiment of present invention, the ultra low-k layer 122 further includes a small amount of fluorine component, wherein the fluorine percentage would gradually increase inward from the surface of ultra low-k layer 122 and reaches a peak value at the depth $d_1$, and then start to decrease gradually to 0%.

In the embodiment of present invention, the compositional change of ultra low-k layer 122 as shown in the curve chart above is resulted from the aforementioned etch back process. Since the effects of plasma ion bombardment in the etch back process and the use of etchant gas containing hydrofluorocarbon compound ($CF_xH_y$), the percentage of carbon, hydrogen, silicon inherently in the ultra low-k layer 122 would gradually increase inward from the surface to their respective inherent level, while the oxygen percentage inversely decreases to its inherent level due to the increase of carbon, hydrogen and silicon percentages. On the other hand, the original ultra low-k layer 122 contains no fluorine component. However, due to the ion bombardment effect, the fluorine percentage would gradually increase inward from the surface and reach a peak value at a depth $d_1$. The influence of etch back process diminishes beyond the depth $d_1$, so that the fluorine percentage would gradually decrease back to its inherent 0% level.

Refer still to FIG. 4. After the etch back and the planarization process, a dual damascene recess 123 is form in a shape of a via and a metal interconnect layer in the ultra low-k layer 122. The dual damascene recess 123 may be formed through dual damascene process to interconnect an underlying metal interconnect layer 106, such as the second metal layer M2, in the logic region 100b. The metal material required for filling in the dual damascene recess 123 may include barrier layers with material like titanium (Ti), titanium nitride (TiN), tantalum (Ta) and/or tantalum nitride (TaN) and low resistance metal layers with material selected from low resistance materials like tungsten (W), copper (Cu), aluminum (Al), titanium aluminum (TiAl) alloy, cobalt-tungsten-phosphorous (CoWP) alloy or the combination thereof. A planarization process, such as a CMP process, is then performed to remove parts of the metal materials above the surface portion 122a, to form the dual damascene structure composed of a via V2 and a metal interconnect layer M3, wherein the via V2 electrically connects the underlying metal interconnect layer 106 in the logic region 100b.

Figure 5:
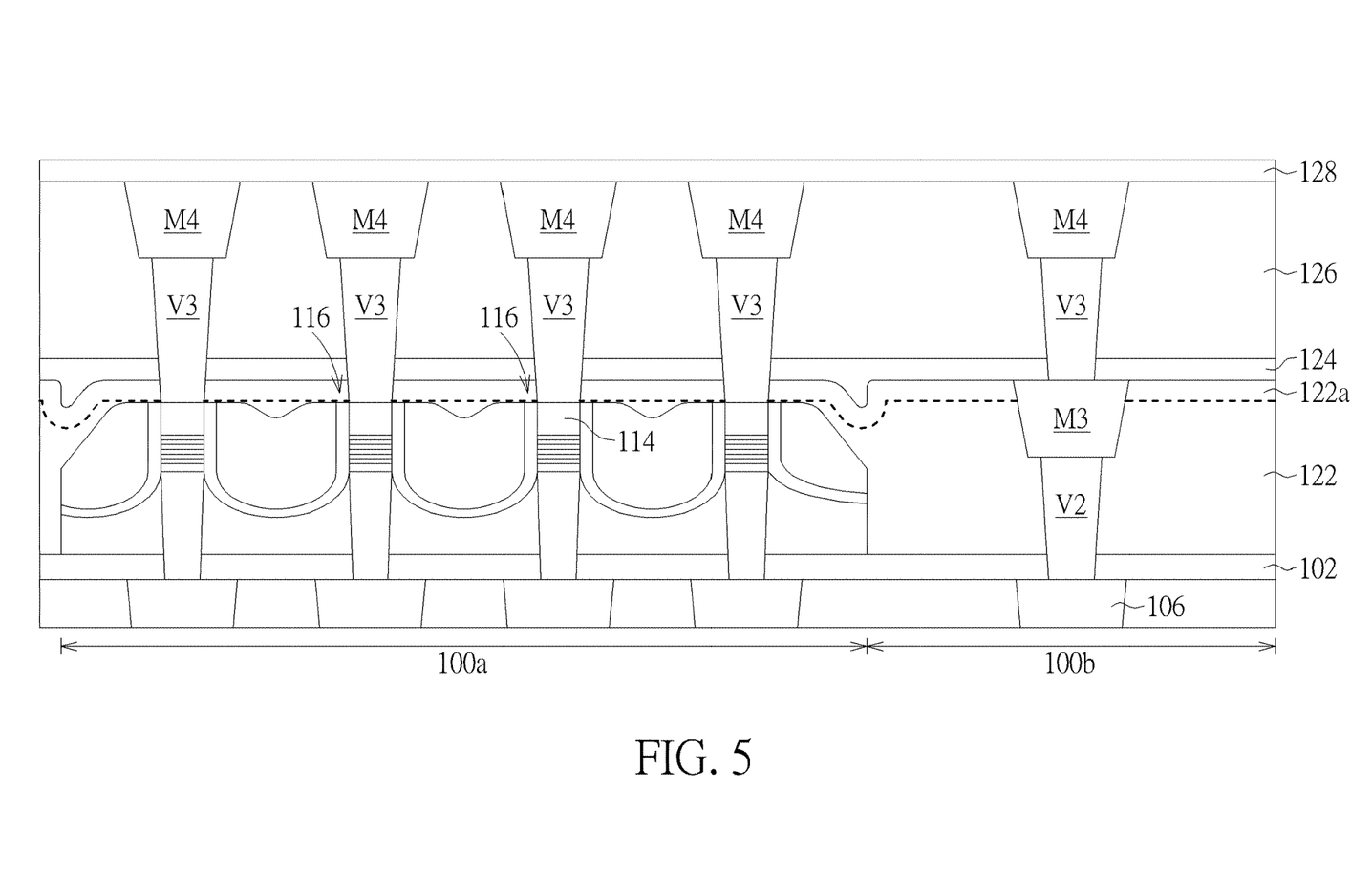

Please still to FIG. 5. After the via V2 and the metal interconnect layer M3 are formed, another stop layer 124 and another inter-metal dielectric layer 126 are formed sequentially on the surface portion 122a and the surface of metal interconnect layer M3. The materials of stop layer 124 and stop layer 102 are the same, which may be silicon carbonitride (SiCN), nitrogen-doped carbide (NDC) or silicon nitride, etc. The materials of inter-metal dielectric layer 126 and ultra low-k 122 are the same, which may be ultra low-k (ULK) material. After the stop layer 124 and the inter-metal dielectric layer 126 are formed, the aforementioned dual damascene process is repeated to form vias V3 and metal interconnect layers M4 in upper tiers, wherein the via V3 above the cell region 100a is electrically connected to the top electrode layer 114 of MRAM cell 116, while the via V3 above the logic region 100b is electrically connected to the metal interconnect layer M3 in lower tiers. Another stop layer 128 may be further formed on the surface of inter-metal dielectric layer 126 after forming the vias V3 and the metal interconnect layers M4, and the aforementioned steps of manufacturing vias and metal interconnect layers may be repeated again.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A magnetoresistive random access memory (MRAM) structure, comprising:
    a substrate;
    multiple MRAM cells on said substrate, wherein said MRAM cells are in a cell region adjacent to a logic region;
    an atomic layer deposition dielectric layer between said MRAM cells and at outer sides of said MRAM cells in said cell region; and
    an ultra low-k layer covering directly on said MRAM cells and said atomic layer deposition dielectric layer and covering entire said logic region and said cell region, wherein dents are formed on the top surface of said ultra low-k layer at boundaries between said cell region and said logic region, and metal layers and vias on said logic region are formed in said ultra low-k layer.

2. The MRAM structure of claim 1, wherein said dents are formed on said top surface of said ultra low-k layer at boundaries between said cell region and a word line.

3. The MRAM structure of claim 1, wherein each said MRAM cell comprises:
    a bottom electrode layer on said substrate;
    a magnetic tunnel junction stack on said bottom electrode layer; and
    a top electrode layer on said magnetic tunnel junction stack.

4. The MRAM structure of claim 1, further comprising a spacer layer on sidewalls of said MRAM cells.

5. The MRAM structure of claim 1, further comprising a nitrogen-doped carbide layer formed on said top surface of said ultra low-k layer and filling up said dents.

6. The MRAM structure of claim 5, further comprising vias passing through said nitrogen-doped carbide layer and said ultra low-k layer and electrically connecting to said MRAM cells.

7. A magnetoresistive random access memory (MRAM) structure, comprising:
    a substrate;
    multiple MRAM cells on said substrate, wherein said MRAM cells are in a cell region adjacent to a logic region;
    an atomic layer deposition dielectric layer between said MRAM cells and at outer sides of said MRAM cells in said cell region; and
    an ultra low-k layer covering directly on said MRAM cells and said atomic layer deposition dielectric layer and covering entire said logic region and said cell region, wherein metal layers and vias on said logic region are formed in said ultra low-k layer, and said ultra low-k layer comprises a fluorine doped surface portion, and a silicon percentage, a hydrogen percentage and a carbon percentage in said ultra low-k layer gradually increase inward from the top surface of said ultra low-k layer and then remain constant, and an oxygen percentage in said ultra low-k layer gradually decreases inward from said top surface of said ultra low-k layer and then remain constant, and a fluorine percentage in said ultra low-k layer gradually increases inward from said top surface of said ultra low-k layer to a depth and then start to decrease gradually to 0%, and said carbon percentage, said hydrogen percentage, said silicon percentage and said oxygen percentage are substantially the same at said top surface of said ultra low-k layer.

8. The MRAM structure of claim 7, where a level of said carbon percentage is greater than a level of said hydrogen percentage and further greater than a level of said silicon percentage and further greater than a level of said oxygen percentage after remaining constant.

9. The MRAM structure of claim 7, wherein each said MRAM cell comprises:
    a bottom electrode layer on said substrate;
    a magnetic tunnel junction stack on said bottom electrode layer; and
    a top electrode layer on said magnetic tunnel junction stack.

10. The MRAM structure of claim 7, further comprising a spacer layer on sidewalls of said MRAM cells.

11. The MRAM structure of claim 7, further comprising a nitrogen-doped carbide layer formed on said top surface of said ultra low-k layer.

12. The MRAM structure of claim 11, further comprising vias passing through said nitrogen-doped carbide layer and said ultra low-k layer and electrically connecting to said MRAM cells.

* * * * *

UNITED STATES PATENT AND TRADEMARK OFFICE
CERTIFICATE OF CORRECTION

PATENT NO. : 11,917,923 B2
APPLICATION NO. : 17/242322
DATED : February 27, 2024
INVENTOR(S) : Hui-Lin Wang et al.

Page 1 of 1

It is certified that error appears in the above-identified patent and that said Letters Patent is hereby corrected as shown below:

On the Title Page

Item (72), correct the addresses (cities) of the 9th inventor (Po-Kai Hsu) from "Taichung (TW)" to --Tainan (TW)--, and the 11th inventor (Ya-Jyuan Hung) from "Tainan (TW)" to --Kaohsiung (TW)--.

Signed and Sealed this
Second Day of April, 2024

Katherine Kelly Vidal
*Director of the United States Patent and Trademark Office*